United States Patent
Rudelic et al.

(10) Patent No.: US 7,533,234 B2
(45) Date of Patent: May 12, 2009

(54) METHOD AND APPARATUS FOR STORING COMPRESSED CODE WITHOUT AN INDEX TABLE

(75) Inventors: John C. Rudelic, Folsom, CA (US); Lance W. Dover, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 193 days.

(21) Appl. No.: 11/128,992

(22) Filed: May 13, 2005

(65) Prior Publication Data

US 2006/0259681 A1    Nov. 16, 2006

(51) Int. Cl.
*G06F 12/00* (2006.01)
*G06F 12/02* (2006.01)

(52) U.S. Cl. .................... 711/170; 711/118; 711/173; 707/101; 709/247; 710/68

(58) Field of Classification Search .................. None
See application file for complete search history.

(56) References Cited

U.S. PATENT DOCUMENTS

| | | | | |
|---|---|---|---|---|
| 5,438,671 A | * | 8/1995 | Miles | 709/247 |
| 5,892,900 A | * | 4/1999 | Ginter et al. | 726/26 |
| 6,981,119 B1 | * | 12/2005 | Lepak et al. | 711/170 |
| 7,035,987 B2 | | 4/2006 | Rudelic | |
| 7,073,040 B2 | | 7/2006 | Rudelic | |
| 7,106,636 B2 | | 9/2006 | Eilert et al. | |
| 2004/0117578 A1 | * | 6/2004 | Castelli et al. | 711/170 |
| 2004/0128430 A1 | | 7/2004 | Rudelic | |
| 2004/0255283 A1 | | 12/2004 | Rudelic et al. | |
| 2005/0286406 A1 | | 12/2005 | Jeon et al. | |
| 2006/0002197 A1 | | 1/2006 | Rudelic | |
| 2006/0004950 A1 | | 1/2006 | Wang et al. | |
| 2006/0004951 A1 | | 1/2006 | Rudelic et al. | |

OTHER PUBLICATIONS

Rudelic, et al. "Embedding a Filesystem into a Non-Volatile Device," U.S. Appl. No. 11/021,528, filed Dec. 22, 2004.
Rudelic, et al. "Architecture Partitioning of a NonVolatile Memory," U.S. Appl. No. 11/069,386, filed Feb. 28, 2005.

* cited by examiner

*Primary Examiner*—Hyung S Sough
*Assistant Examiner*—Kaushikkumar Patel
(74) *Attorney, Agent, or Firm*—David P. McAbee

(57) ABSTRACT

A method and apparatus is described herein for compressing a binary image in memory and decompressing a portion memory in response to a request, without using a compression index table to find relocated compressed code. A binary image is traversed in windows. Each selected window is compressed to form compressed windows having a compressed portion and an available memory portion. Static data is backfilled in available memory portions to achieve efficient compression. Upon receiving a request to a specific physical address, the compressed portion of that physical location is decompressed and provided for execution without using a compression index table, as the compressed code portion was not relocated from its original physical location.

20 Claims, 6 Drawing Sheets

METHOD AND APPARATUS FOR STORING COMPRESSED CODE WITHOUT AN INDEX TABLE

FIELD

This invention relates to the field of data storage and, in particular, to storing compressed data on memory devices.

BACKGROUND

As devices, such as cell phones and personal digital assistants, get smaller and the programs loaded on such devices become more complex, the need for efficient data/code storage becomes particularly important. Often smaller embedded systems use flash memory to store object code and constant data.

Currently, to increase the storage capacity of a flash memory, compression algorithms are used to compress stored data. Yet, most compression techniques focus on maximum compression, rather than the performance associated with decompression during execution. In fact, some compression algorithms relocate data in an attempt to achieve maximum compression. To track where the data is relocated to, an index or translation table is usually used.

In a specific example, if code is stored at a first location and then compressed and relocated to a second location, an index table associates the first location with the second location. Therefore, upon a request referencing the first location, the index table is used to retrieve the code now stored at the second location. Yet, the use of a translation table introduces delay into fetching data or code to be operated on or executed.

BRIEF DESCRIPTION OF THE DRAWINGS

The present invention is illustrated by way of example and not intended to be limited by the figures of the accompanying drawings.

DETAILED DESCRIPTION

Figure 1A:
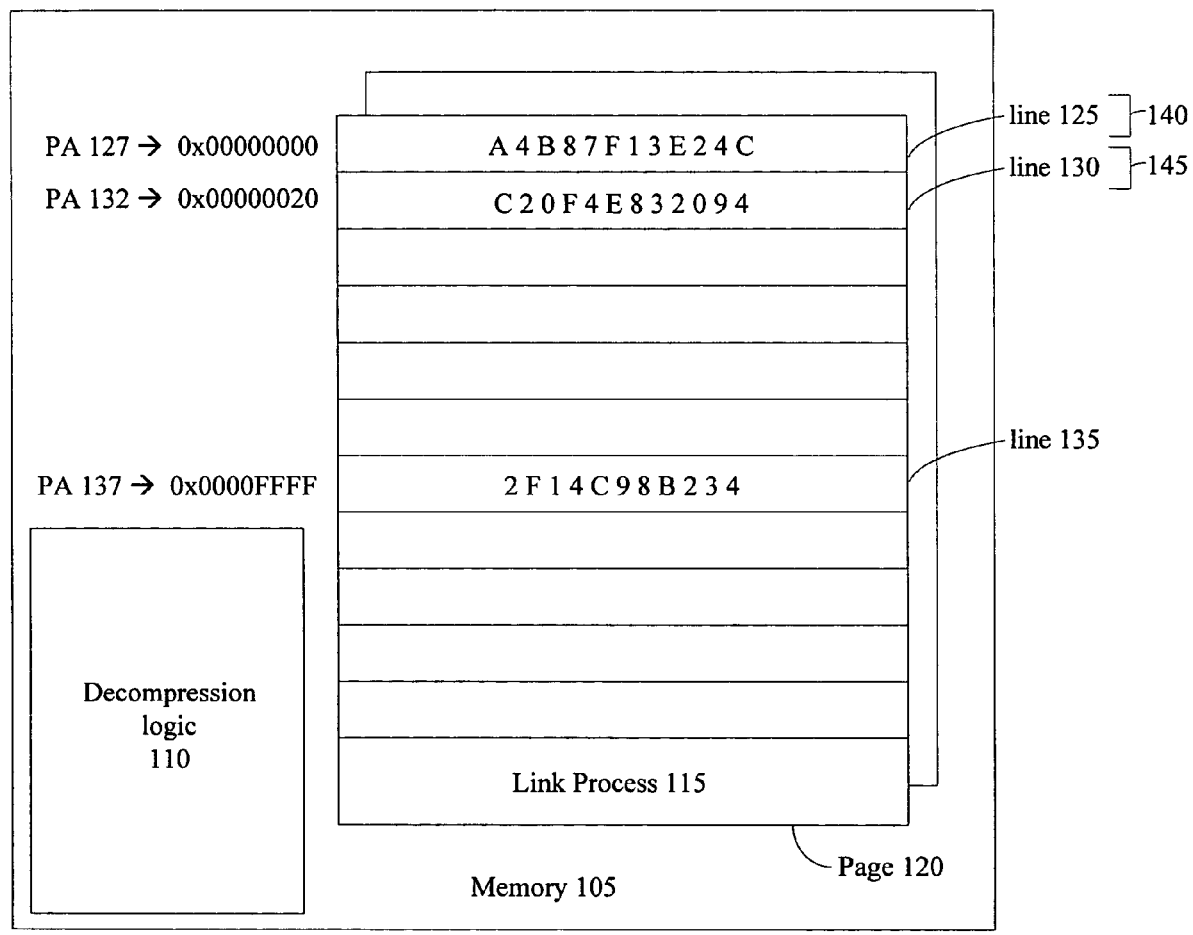
FIG. 1a illustrates an embodiment of a memory device logically viewed as memory broken up into pages and lines.

In the following description, numerous specific details are set forth such as specific types of flash memory, specific segment and window sizes, and specific types of encoding in order to provide a thorough understanding of the present invention. It will be apparent, however, to one skilled in the art that these specific details need not be employed to practice the present invention. In other instances, well known components or methods, such well-known flash design and specific architectures/instructions, etc., have not been described in detail in order to avoid unnecessarily obscuring the present invention.

FIG. 1 illustrates an embodiment of memory device 105. Memory device 105 may be a static random access memory (SRAM), a dynamic random access memory (DRAM), an electrically programmable read-only memory (EPROM), an electrically erasable programmable read only memory (EEPROM), a nonvolatile memory, or a flash device. As an example, memory 105 is a NOR flash device. However, memory 105 is not so limited, as it may be a NAND flash device.

As shown in FIG. 1, memory 105 is logically organized and/or viewed as broken up into pages, such as page 120, and memory lines, such as lines 125, 130, and 135. In one embodiment, lines 125, 130, and 135 are cache lines in memory 105. In another embodiment, lines 125, 130, and 135 are word lines in a NOR flash device. Nevertheless, memory 105 and lines 125, 130, and 135 may be arranged in any physical manner. For example, at its lowest level memory 105 includes transistors that store at least one bit per transistor cell. In another embodiment, multiple bits are stored per each transistor, as in a multi-level cell structure.

Each of memory lines 125, 130, and 135 are referenced/associated with a physical address. As an example, physical address 127 is associated with line 125, physical address 132 references line 130, and physical address 137 references line 135. A request to memory often includes or references a physical address. Therefore, a request to physical address 127, which is associated with line 125, is typically a request for the contents of line 125, shown in FIG. 1a as A4B87F13E24C.

Memory lines may store data, code, object code, constant data, static data, binary information, or any other code or data commonly stored in memory devices. In a specific embodiment, lines 125 and 130 store object code, while line 135 stores static or constant data. Examples of static/constant data include characters, language sets, strings, and other data that is not commonly modified after initial storage, such as data typically stored in non-cacheable read only memory.

Decompression logic 110, shown in FIG. 1a, is for decompressing code stored in compressed portions of memory 105. Decompression logic 110 is discussed in more detail below in reference to FIG. 1b and FIG. 2.

Figure 1B:
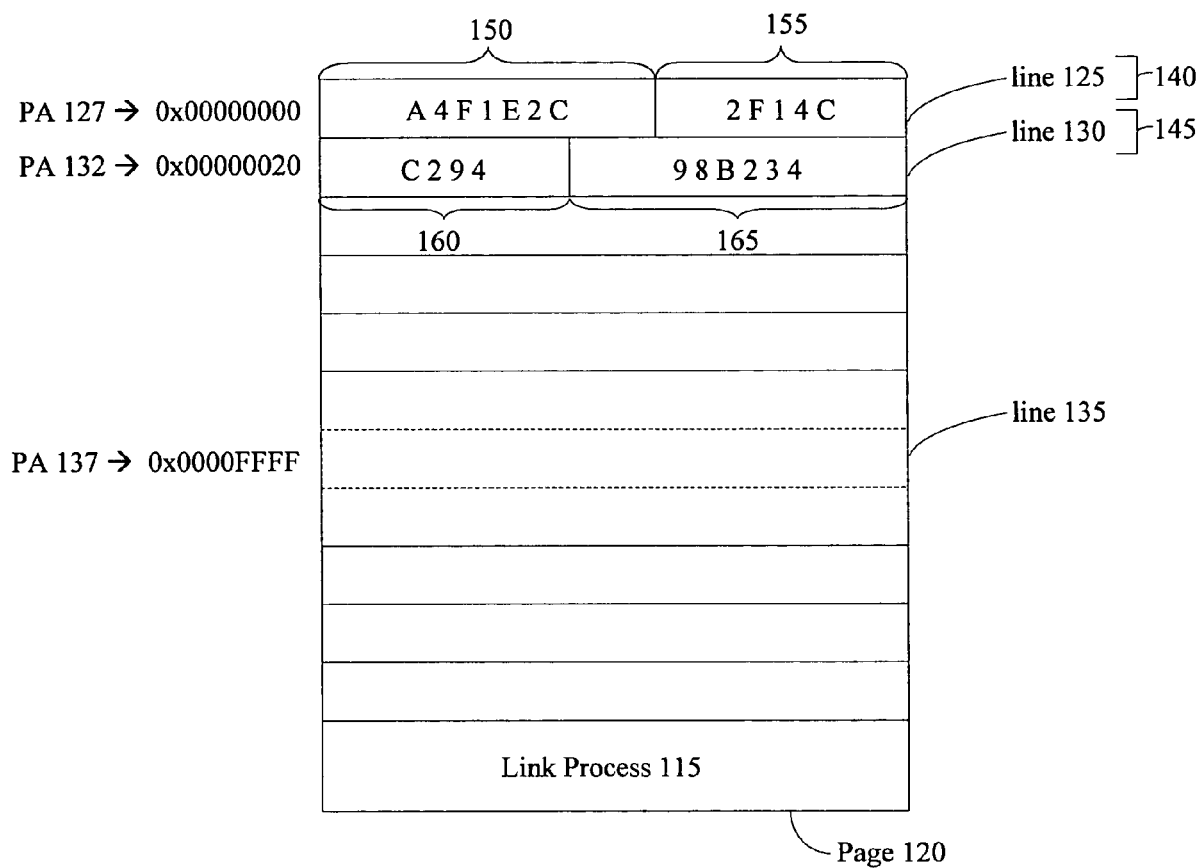
FIG. 1b illustrates an embodiment of a page of the memory from FIG. 1a, after data has been compressed and available space portions have been filled with constant data.

FIG. 1b illustrates an embodiment of a page of memory, such as page 120, after compression. Compression, in one embodiment, includes traversing a binary image, which refers to binary values stored in a memory, in segments or windows, such as windows 140 and 145, and compressing each window individually.

In FIG. 1b, a window is illustrated as having a predefined size of one memory line. The predefined size of a window is variable. For instance, a window size may be equivalent to a hierarchical level in a memory, such as a line or page of the memory, as well as a specific number of bits or bytes. Examples of specific sizes may include 32, 64, or 128 bytes. In accordance with those examples, a line of memory, such as a cache line, has a corresponding size of 32, 64, or 128 bytes. As another embodiment, the predefined size of a window is the size of a page. An illustrative example of a page size is 4096 bytes.

When traversing, i.e. walking through, a binary image in segments, each segment or any selection of the segments may be compressed. As an example, a link process, such as link process 115 stored in memory 105, when executed, is used to compress lines of memory 105, log available memory portions established by compressing memory lines, and place constant/static data in the available memory portions. Link process 115 may be used in conjunction with other firmware, hardware, and software, such as a compiler, to compress code, log available memory, and back-fill available memory with static data.

In one embodiment, all of the segments containing code, such as line 125 and line 130, are compressed. However, any criteria, such as the length of the data or placement in the memory, may be used to determine which windows/segments to compress.

Furthermore, any commonly known encoding or compression technique may be used to compress a segment. For example, Huffman encoding is used to compress segments 125 and 130. Huffman encoding typically includes an encoding scheme where individual symbols, such as a character, are replaced by bit sequences that have a distinct length. Therefore, for characters that appear often, short bit sequences are used, and for characters that rarely appear, longer bit patterns are used. Nevertheless, any representation or other encoding method or technique may be used.

As illustrated in FIG. 1b, after compression of window 140, compressed portion 150 and available space portion 155 are established. In this illustration, the contents of line 125 from FIG. 1a have been compressed into compressed code portion 150, leaving the rest of line 125 empty, i.e. available. As further shown in FIG. 1b, compressed portion 160 is smaller than compressed portion 150; therefore, line 130's available space portion 165 is larger than available space portion 155.

In one embodiment, available space portions 155 and 165 are logged to track the location and size of available space portions. As an example, as each window is being compressed, the available space portion created by compressing the current window is logged. Any commonly known method of logging a range in memory may be used. As a first example, the physical address, such as physical address 127, of an available space portion along with the size of the available space portion is stored/logged. As a second example, a base physical address is stored and offsets to the available space portions are logged.

Since line 125 and 130 now have available space that is being unused, contents of other lines are filled/back-filled to utilize memory 105 as efficiently as possible. Once again, any criteria for selecting lines to fill available space portions may be used. For instance, lines with constant or static data, such as line 135, are used to back-fill available space portions 155 and 165. A segment or portion of line 135 is back-filled into available space portion 155 and another segment or portion of line 135 is filled into available space portion 165. As illustrated, the contents of three lines in FIG. 1a are compressed into two lines in FIG. 1b, with the compressed code lines 125 and 130 remaining at their original locations/physical addresses.

Furthermore, when a request referencing physical address 127 is received, compressed portion 150 is directly accessed and decompressed without use of index or lookup table. Unlike a situation where compression required relocation of the compressed code to a different physical location, the compressed code remains at the same physical location. Therefore, when a request is received for a specific physical address, decompression logic 110, shown in FIG. 1a, decompresses the compressed portion without address translation or incurring delay associated with a lookup table.

Decompression logic 110 may include a decompression engine implemented in hardware, software, and/or firmware. In one embodiment, decompression logic 110 is a decompression engine implemented in hardware on memory 105. For example, if Huffman encoding was used to compress information, then decompression engine 110 in hardware re-assigns pre-assigned bit values to characters or numbers to decompress the compressed information. As another example, firmware, which is a combination of hardware and software is used to decompress compressed information. In yet another embodiment, a software program stored on memory 105, when executed, is used as decompression logic 110.

Any number of methods may be used to determine where the compressed code ends and the available space begins. As a first example, the size of the compressed code section is determined upon compression. Where Huffman encoding is used, each symbol is represented by a predefined number of bits. Therefore, the number of bits for each symbol encoded is added together to get the size of the compression window. In another example, the size of the compressed code section is determined from subtracting the size of the logged available space section from the size of the window.

Figure 2:
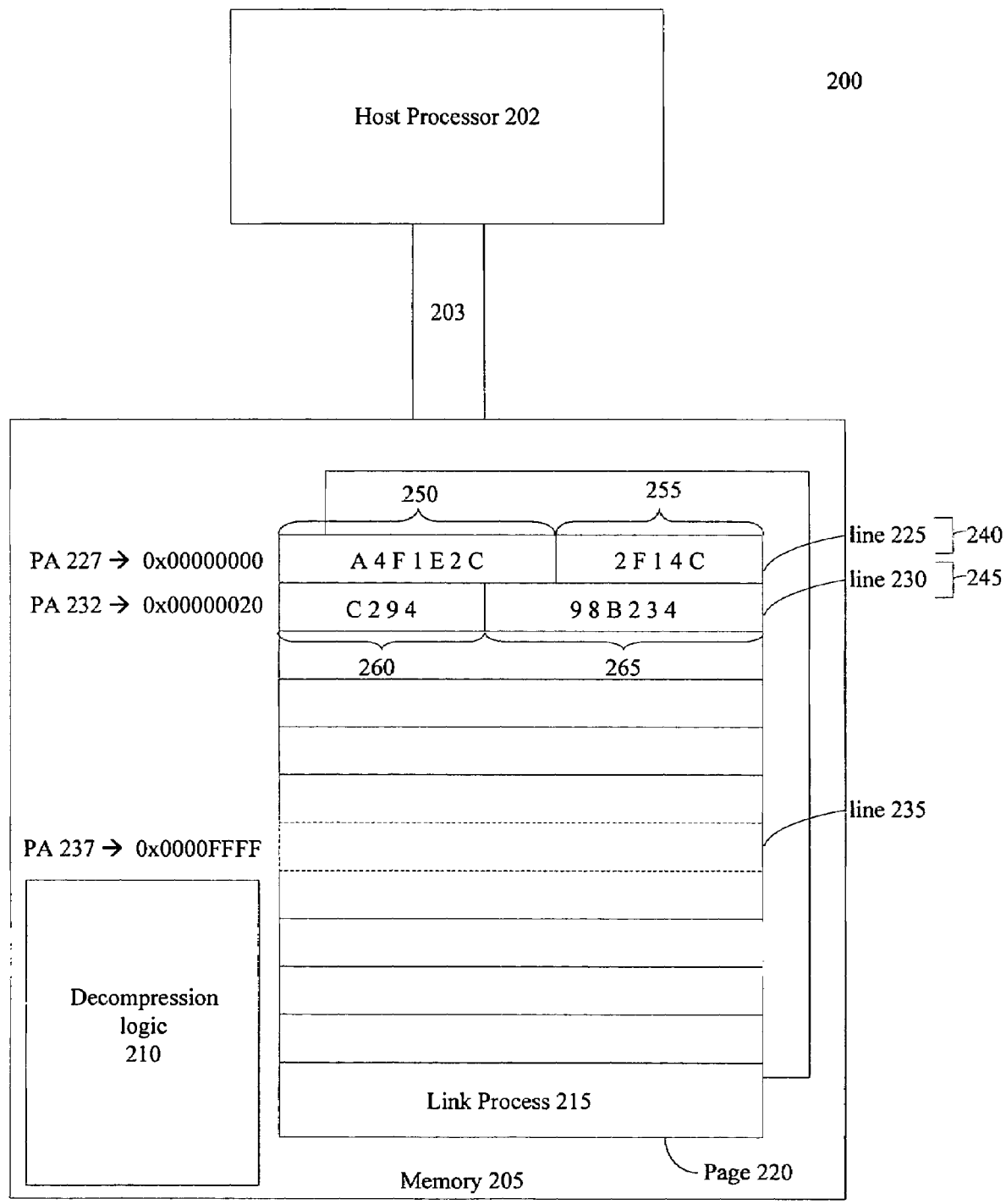
FIG. 2 illustrates an embodiment of a system having a host processor and a memory device.

Turning to FIG. 2, an embodiment of a system with a host processor and a memory having a compressed image is illustrated. Host processor 202 is coupled to memory 205 by interconnect 203. Any number of components, such as a controller hub or chipset, may be coupled between host processor 202 and memory 205. Host processor 202 may be a microcontroller, an embedded controller, a microprocessor, a digital signal processor, a co-processor, or a programmable array device. In one embodiment, host processor 202 and memory 205 are part of an execute in place (XiP) architecture.

Host processor 202 generates a request referencing a physical address, such as physical address 227. Previously, with use of an index table when memory 205 received the request, an index table would be used to lookup the compressed location of code that was stored in an uncompressed format at physical address 227. However, in this embodiment, when memory 205 receives a request referencing physical address 227, compressed portion 250 is directly accessed without use of an index table. Here, the uncompressed code that was stored at physical address 227 was compressed into compressed portion 250, which still resides at physical address 227. Therefore, decompression logic 210 decompresses compressed portion 250 based directly on the request referencing physical address 227 and provides uncompressed code, such as an instruction, back to host processor 202 for execution.

Figure 3A:
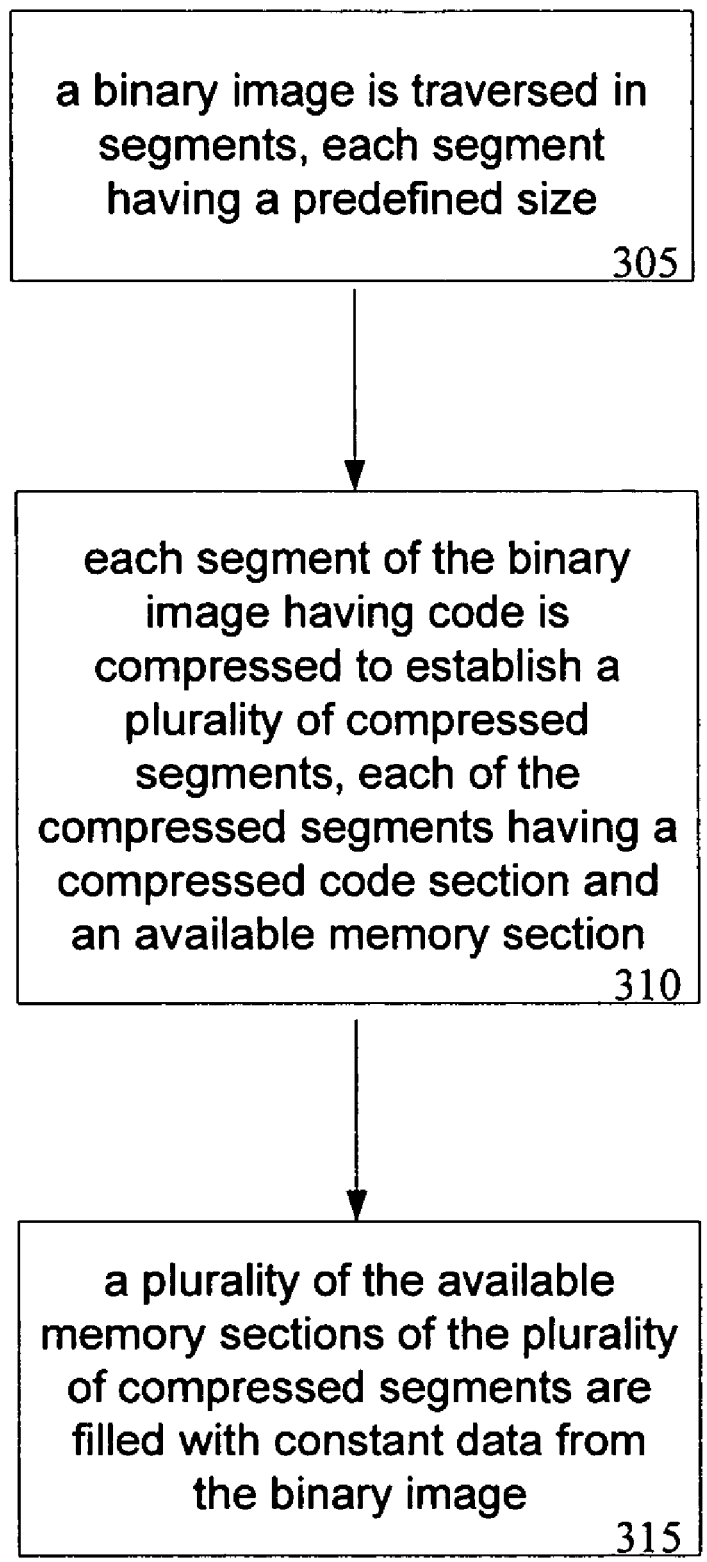
FIG. 3a illustrates a flow diagram of an embodiment for compressing a binary image.

Next, FIG. 3a illustrates a flow diagram of an embodiment for compressing a binary image. In block 305, a binary image is traversed in segments, i.e. windows. A segment or window has a fixed predefined size. As an example, a window is the size of a line, such as a cache line, in a memory. Furthering the example, if a cache line has a size of 32 bytes, then a window has the size of 32 bytes. As a consequence, the binary image is traversed cache line by cache line. Other examples of segment or window sizes include a page in memory or a specific size, such as 32 bytes, 64 bytes, 128 bytes, and 4096 bytes.

In the next block, block 310, each segment of the binary image having code is compressed. Therefore, while traversing the binary image, when a window having code is encountered, it is compressed to form/establish a compressed segment/window. As stated above, any encoding method, such as Huffman encoding, may be used to compress the code. The compressed segments, after compression, each have a compressed code section and an available memory section. The compressed code section comprising the previously compressed code and the available memory section comprising the section of the window/segment in memory that was freed up by the compression.

In another embodiment, a plurality of uncompressed segments of the binary image having code are compressed to establish a plurality of compressed segments, each of the compressed segments remaining at the uncompressed segment's corresponding physical address, wherein each compressed segment comprises a contiguous compressed code and available memory section. Therefore, the compressed code remains at its original physical location/address, but is compressed to free storage for constant data.

In block 315, a plurality of the available memory sections from the compressed segments in the binary image are filled with constant/static data. After compression, a plurality of compressed segments have an available memory section. Therefore, to efficiently use memory space, constant data, such as strings, characters, and language sets, commonly statically stored, are back-filled into those plurality of available memory sections.

As an example, referring back to FIG. 1b, line 125 has compressed portion 150 and available space portion 155. Available space portion 155 is back filled with a part of line 135's contents, i.e. static data. After compression and filling line 130 with the remaining contents of line 135, line 130 is available for storage, while maintaining code in line 125 and 130 at their respective physical addresses in a compressed state. Consequently, upon a request to physical address 127 or 132, the compressed portions are decompressed and provided to the requestor with no address translation or index table lookup delay.

Figure 3B:
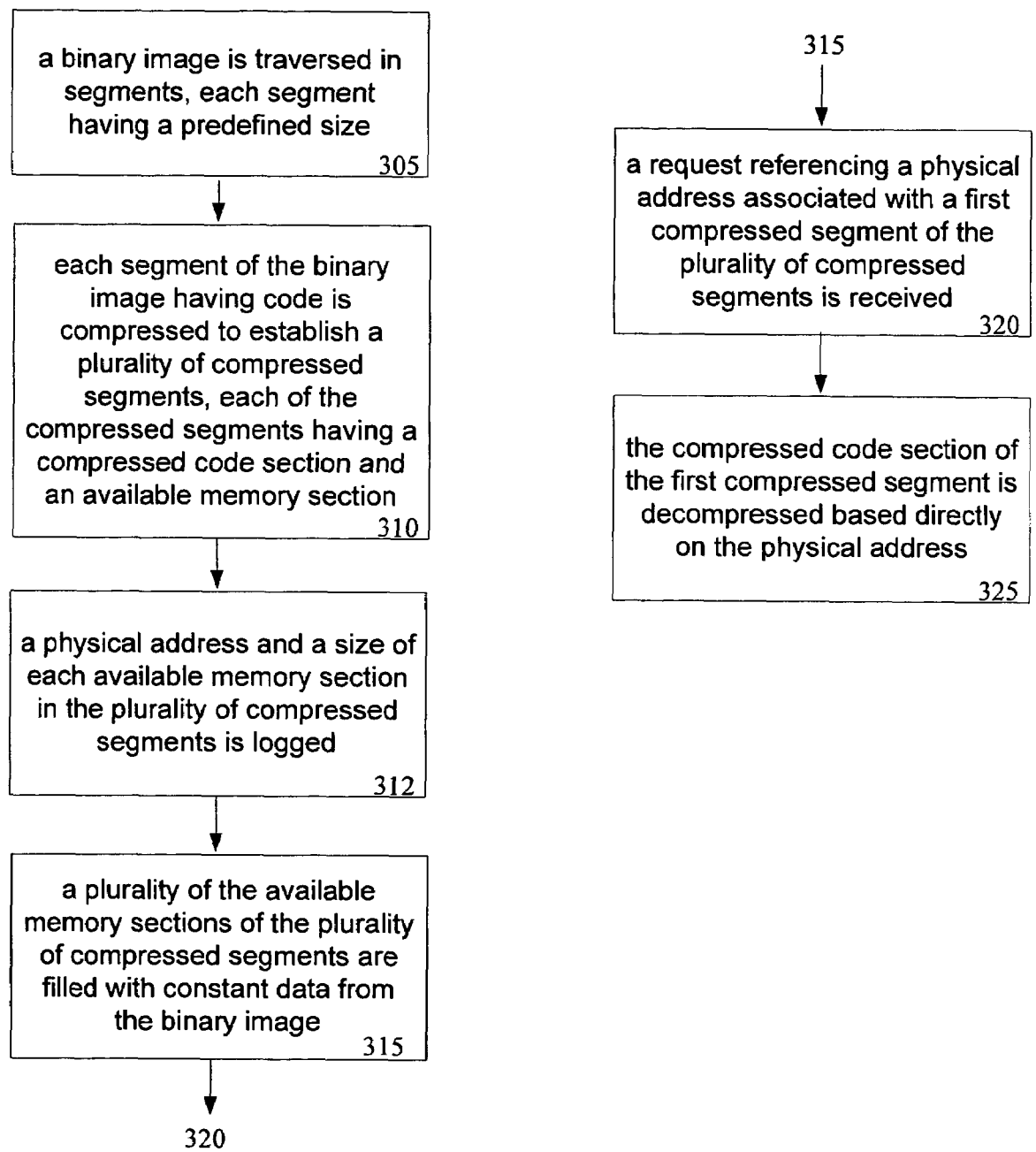
FIG. 3b illustrates a flow diagram of another embodiment for compressing a binary image.

Turning to FIG. 3b, a flow diagram of another embodiment for compressing a binary image is illustrated. Here, block 305, 310, and 315 remain the same. Additionally, in block 312 available memory sections are logged. In one embodiment, logging available memory sections comprise logging/storing a physical address and a size associated with available memory section. As another example, a general base address is stored and offsets to available memory sections are stored. As can be seen from the illustrative embodiments, logging available memory may be done by any commonly known method of logging a range in memory.

In block 317 a request referencing a physical address associated with a compressed segment is received. As a first example, referencing a physical address comprises including the full physical address in the request. As another example, a stored or received base address, page address, and/or offset is used to reference the physical address. As an illustration, a portion of the request references the page of the memory and a portion of the request references an offset within the page of memory where the physical address is located.

In block 325, the compressed portion referenced by the request is decompressed based directly on the physical address. As stated above, once the request is decoded to the physical location referenced by the request, no additional index lookups are required to find relocated compressed code. Therefore, based directly on the physical address, the compressed portion is decompressed.

Figure 4:
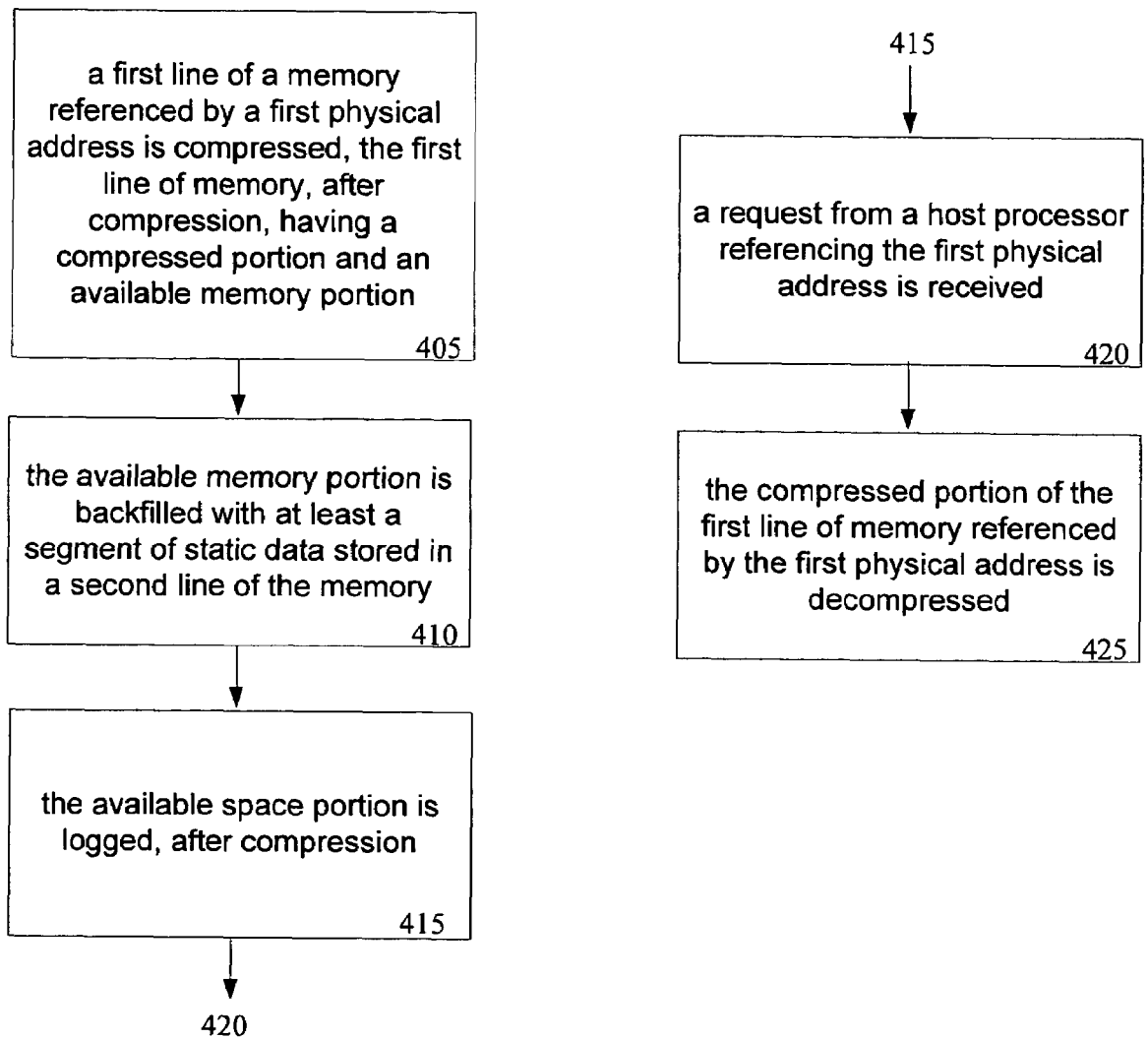
FIG. 4 illustrates a flow diagram of yet another embodiment for compressing a binary image.

FIG. 4 illustrates a flow diagram of yet another embodiment for compressing a binary image. In block 405, a first line of memory is compressed. The first line of the memory is referenced by a first physical address. After compression, the first line of memory has a compressed portion and an available memory portion. The aforementioned methods of compression and traversing a memory may be used. As stated above the memory may be a static random access memory (SRAM), a dynamic random access memory (DRAM), an electrically programmable read-only memory (EPROM), an electrically erasable programmable read only memory (EEPROM), a nonvolatile memory, or a flash device. Specific examples of a flash device include a NOR and a NAND flash device.

Next, in block 410 the available memory portion is logged. The portion of the line that is freed by the compression is logged to track where available memory is and how much memory is available in that line. After logging the available memory portion, the available memory portion is backfilled with at least a segment of static data from a second line of memory. Since the first line of memory still contains compressed code, some portion or segment of a second line of memory is placed in the available memory section of the first line. This potentially leaves a portion or segment of the static data in the second memory line to remain at that location or be placed in another available memory section. However, backfilling the available memory portion is not so limited. In fact, where a remaining segment, such as in line 130 of FIG. 1b, is being stored, essentially all of the static data in the second line of memory is being relocated.

In blocks 420 and 425, a request from a host processor referencing the first physical address, i.e. the first line of memory, is received and the compressed portion of the first line of memory is decompressed. As mentioned above, when a request referencing the first line of memory is received, the compressed portion of the first line of memory is directly decompressed. Therefore, this compression and decompression is usable in an XiP architecture, where the image in memory is compressed, but information is provided directly from referenced addresses without using an indexing table.

As can be seen from above, memory may be compressed on a window by window basis, which allows for the efficient use of memory. Yet, relocation of code to different physical address locations to achieve the compression potentially introduces delay into the decompression of data during operation. Therefore, based on physical addresses referenced by requests, compressed code portions, which are located at their original uncompressed physical addresses, are decompressed on the fly and provided to a host processor for execution or operation, without having the additional logic and delay associated with a compression index table.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
    traversing a binary image in segments, each segment having a corresponding physical address and a predefined size;
    compressing a plurality of uncompressed segments of the binary image holding code to establish a plurality of compressed segments, each of the compressed segments remaining at the uncompressed segment's corresponding physical address, wherein each compressed segment comprises a contiguous compressed code and available memory section; and
    not compressing a plurality of segments holding constant data in the binary image; and
    filling a plurality of the available memory sections of the plurality of compressed segments with the constant data from the binary image.

2. The method of claim 1, wherein the binary image is stored in a memory, and wherein the predefined size is equal to a size of a cache line in the memory.

3. The method of claim 2, wherein the size of the cache line is selected from a group consisting of 32 bytes, 64 bytes, and 128 bytes.

4. The method of claim 2, wherein the predefined size is equal to a size of a page of the memory, the size of the page of the memory is 4096 bytes.

5. The method of claim 1, wherein each segment comprising code is compressed using Huffman encoding.

6. The method of claim 1, further comprising:
logging a physical address and a size of each available memory section in the plurality of compressed segments.

7. The method of claim 1, further comprising:
receiving a request referencing a physical address associated with a first compressed segment of the plurality of compressed segments; and
decompressing the compressed code section of the first compressed segment based directly on the physical address.

8. The method of claim 1, wherein the constant data comprises static data selected from a group consisting of strings, characters, and language sets.

9. A method comprising:
compressing a first line of a memory referenced by a first physical address, the first line of memory, after compression, having a first compressed portion and a first available memory portion;
compressing a second line of the memory referenced by a second physical address that is immediately subsequent to the first line of the memory, the second line of memory, after compression, having a second compressed portion and a second available memory portion;
backfilling the first and the second available memory portions with static data held in the memory after compressing the first line and the second line;
receiving a request from a host processor referencing the first physical address; and decompressing the first compressed portion of the first line of memory referenced by the first physical address.

10. The method of claim 9, wherein the memory is a NOR flash device, and wherein the host processor and the NOR flash are part of an execute in place (XiP) architecture.

11. The method of claim 9, wherein decompressing the compressed portion of the first line of memory referenced by the first physical address comprises decompressing the compressed portion referenced by the first physical address without performing a compression index table lookup.

12. An apparatus comprising:
a flash device logically organized into a plurality of lines, wherein a first line of the plurality of lines, which is referenced by a first physical address, holding code and a second line of the plurality of lines holding static data;
a link process stored on the flash device, when executed, compresses the first line forming an available space portion and a compressed code portion within the first line, and places at least a segment of the static data stored in the second line in the available space portion, and
a decompression engine in the flash device decompresses the compressed portion of the first line, upon receiving a request referencing the first physical address.

13. The apparatus of claim 12, wherein the link process, when executed, also logs the available space portion, and wherein logging the available space portion comprises logging a physical address and a size associated with the available space portion.

14. The apparatus of claim 12, wherein the flash device is a NOR flash device, and wherein Huffman encoding is used to compress the first line.

15. The apparatus of claim 12, wherein the static data is selected from a group consisting of at least a portion of a string, a character, and a language set.

16. The apparatus of claim 12, wherein decompressing the compressed portion of the first line, upon receiving a request referencing the first physical address comprises
directly accessing the compressed portion without using a lookup table; and decompressing the compressed portion.

17. A system comprising:
a memory having a first memory line of a plurality of memory lines, the first memory line is referenced by a first physical address, wherein the first memory line comprises a first portion to holding compressed code and a second portion to holding static data;
a host processor generates a request referencing the first physical address; and
logic in the memory decompresses the first portion into uncompressed code without performing a lookup in a compression table and to provides the uncompressed code to the host processor without providing the static data to the host processor in response to the request referencing the first physical address being is received by the memory.

18. The system of claim 17, wherein the memory is a NOR flash device, and wherein the first memory line is a cache line in the NOR flash device.

19. The system of claim 18, wherein the NOR flash device also stores a link process, which, when executed, compresses code in the first memory line;
log the first physical address and the size of the second portion of the first memory line; and
place the static data in the second portion.

20. The system of claim 17, wherein the host processor is a device selected from a group consisting of a microcontroller, an embedded controller, a microprocessor, a digital signal processor, a co-processor, and a programmable array device.

* * * * *